United States Patent
Kokubun et al.

(10) Patent No.: US 9,160,371 B2
(45) Date of Patent: Oct. 13, 2015

(54) MEMORY CONTROLLER, STORAGE DEVICE AND MEMORY CONTROL METHOD

(71) Applicant: Kabushiki Kaisha Toshiba, Minato-ku (JP)

(72) Inventors: Naoaki Kokubun, Yokohama (JP); Osamu Torii, Setagaya-ku (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 70 days.

(21) Appl. No.: 14/193,166

(22) Filed: Feb. 28, 2014

(65) Prior Publication Data

US 2015/0067453 A1    Mar. 5, 2015

Related U.S. Application Data

(60) Provisional application No. 61/873,957, filed on Sep. 5, 2013.

(51) Int. Cl.
*H03M 13/00* (2006.01)
*H03M 13/15* (2006.01)

(52) U.S. Cl.
CPC ................... *H03M 13/151* (2013.01)

(58) Field of Classification Search
CPC .......... H03M 13/151; H03M 13/2906; H03M 13/1515; H03M 13/152; H03M 13/09
USPC ........................................ 714/781
See application file for complete search history.

(56) References Cited

U.S. PATENT DOCUMENTS

| | | | |
|---|---|---|---|
| 8,418,042 B2 | 4/2013 | Kanno | |
| 8,924,820 B2 * | 12/2014 | Hara et al. | 714/773 |
| 8,954,828 B2 * | 2/2015 | Torii et al. | 714/784 |
| 2005/0166120 A1 * | 7/2005 | Ojard | 714/755 |
| 2009/0077447 A1 * | 3/2009 | Buckley et al. | 714/757 |
| 2009/0241008 A1 * | 9/2009 | Kim et al. | 714/755 |
| 2010/0306631 A1 * | 12/2010 | Cheong et al. | 714/800 |
| 2012/0144272 A1 | 6/2012 | Franceschini et al. | |
| 2013/0104002 A1 | 4/2013 | Hara et al. | |
| 2013/0246887 A1 | 9/2013 | Torii et al. | |
| 2013/0305120 A1 | 11/2013 | Torii et al. | |
| 2014/0101514 A1 * | 4/2014 | Cho et al. | 714/758 |

FOREIGN PATENT DOCUMENTS

| | | |
|---|---|---|
| JP | 2011-203878 | 10/2011 |
| JP | 2012-118979 | 6/2012 |
| JP | 2013-89082 | 5/2013 |

* cited by examiner

*Primary Examiner* — David Ton
(74) *Attorney, Agent, or Firm* — Oblon, McClelland, Maier & Neustadt, L.L.P.

(57) ABSTRACT

According to one embodiment, a memory controller in an embodiment includes an encoding unit configured to generate a first parity group from first group data including first and second unit data using $G_1(x)$, generate a second parity group from second group data including third and fourth unit data using $G_1(x)$, and generate a third parity group from the first and second group data and the first and second parity groups using $G_2(x)$, a root of which continues form a root of $G_1(x)$. The memory controller writes the first to fourth unit data and the first to third parity groups in different pages of a nonvolatile memory.

14 Claims, 5 Drawing Sheets

МЕМORY CONTROLLER, STORAGE DEVICE AND MEMORY CONTROL METHOD

CROSS-REFERENCE TO RELATED APPLICATIONS

This application is based upon and claims the benefit of priority from Provisional Patent Application No. 61/873,957, filed on Sep. 5, 2013; the entire contents of which are incorporated herein by reference.

FIELD

Embodiments described herein relate generally to a memory controller, a storage device and a memory control method.

BACKGROUND

In a NAND flash memory (hereinafter referred to as NAND memory), data is written in a unit of data called page unit. The data in a page unit (a page data) is written in one page of the NAND memory. An error correction circuit protects each of the page data written in the one page of the NAND memory through error correction encoding. In addition, for stronger protection, the error correction circuit sometimes performs processing of the error correction encoding for a plurality of the page data.

DETAILED DESCRIPTION

In general, according to one embodiment, a memory controller in an embodiment includes an encoding unit configured to generate a first parity group using a first generator polynomial, generate a second parity group using the first generator polynomial, and generate a third parity group using a second generator polynomial. The first parity group is generated for first group data including first unit data and second unit data. The second parity group is generated for second group data including third unit data and fourth unit data. The third parity group is generated for the first group data, the second group data, the first parity group, and the second parity group. The second generator polynomial has consecutive roots from roots of the first generator polynomial. The memory controller writes the first to fourth unit data and the first to third parity groups respectively in different pages of the nonvolatile memory.

Exemplary embodiments of a memory controller, a memory controller, a storage device and a memory control method will be explained below in detail with reference to the accompanying drawings. The present invention is not limited to the following embodiments.

First Embodiment

Figure 1:
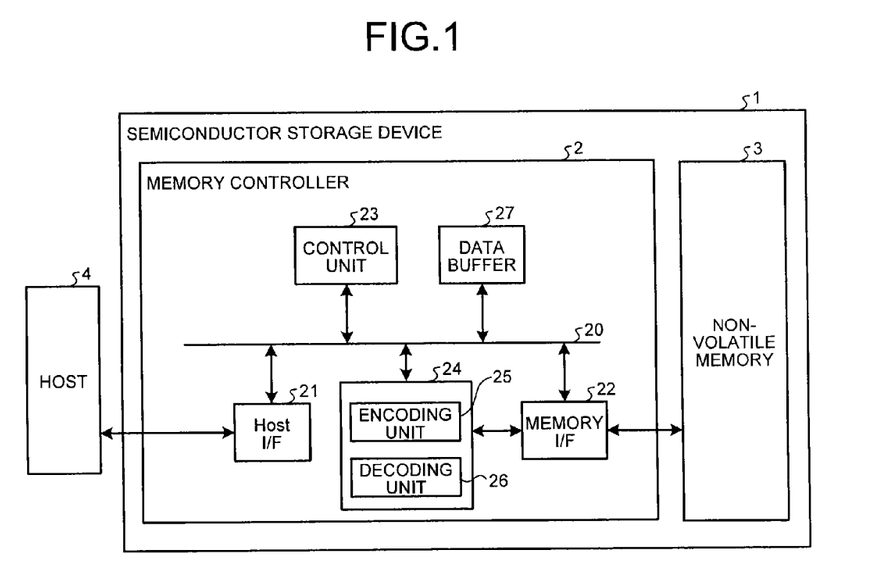
FIG. 1 is a block diagram of a configuration example of a semiconductor storage device according to a first embodiment.

FIG. 1 is a block diagram of a configuration example of a storage device (a semiconductor storage device) according to a first embodiment. A semiconductor storage device 1 in this embodiment includes a memory controller 2 and a nonvolatile memory 3. The semiconductor storage device 1 is connectable to a host 4. In FIG. 1, a state in which the semiconductor storage device 1 is connected to the host 4 is shown. The host 4 is, for example, an electronic apparatus such as a personal computer or a portable terminal.

The nonvolatile memory 3 is a nonvolatile memory configured to store data in a nonvolatile manner. The nonvolatile memory 3 is, for example, a NAND memory. Note that, in an example explained below, the NAND memory is used as the nonvolatile memory 3. However, the nonvolatile memory 3 can be a memory other than the NAND memory. In the NAND memory, in general, data is written and read out for each of write unit data called page.

The memory controller 2 controls writing in the nonvolatile memory 3 according to a write command received from the host 4. The memory controller 2 controls readout from the nonvolatile memory 3 according to a readout command received from the host 4. The memory controller 2 includes a Host I/F 21, a memory I/F 22 (a write control unit), a control unit 23, an ECC (Error Correcting Code) unit 24, and a data buffer 27, which are connected to one another by an internal bus 20.

The Host I/F 21 outputs a command, user data (write data), and the like received from the host 4 to the internal bus 20. The Host I/F 21 transmits user data read out from the nonvolatile memory 3, a response received from the control unit 23, and the like to the host 4.

The memory I/F 22 controls, based on an instruction of the control unit 23, processing for writing user data and the like in the nonvolatile memory 3 and processing for readout from the nonvolatile memory 3.

The control unit 23 collectively controls the semiconductor storage device 1. The control unit 23 is, for example, a central processing unit (CPU) or a micro processing unit (MPU). When the control unit 23 receives a command from the host 4 through the Host I/F 21, the control unit 23 performs control conforming to the command. For example, the control unit 23 instructs, according to a command received from the host 4, the memory I/F 22 to write user data and parity in the nonvolatile memory 3. The control unit 23 instructs, according to a command received from the host 4, the memory I/F 22 to read out user data and parity from the nonvolatile memory 3.

The control unit 23 determines, for user data accumulated in the data buffer 27, a storage area (a memory area) on the nonvolatile memory 3. The user data is stored in the data buffer 27 through the internal bus 20. The control unit 23 determines a memory area for data (page data) in page units, which are write units. In this specification, user data stored in one page of the nonvolatile memory 3 is defined as unit data. When below-mentioned page parity is generated for the unit data, the unit data and the page parity is stored in one page of the nonvolatile memory 3 as one page data. If the page parity is not generated for the unit data, the unit data is stored in one page of the nonvolatile memory 3 as one page data. In this specification, memory cells connected in common to one word line are defined as a memory cell group. When the memory cells are single level cells, the memory cell group corresponds to one page. When the memory cells are multilevel cells, the memory cell group corresponds to a plurality of pages. For example, when 2-bit storable multilevel cells are used, the memory cell group corresponds to two pages. The control unit 23 determines, for each of the unit data, a write-destination memory area of the nonvolatile memory 3. A physical address is allocated to the memory area of the nonvolatile memory 3. The control unit 23 manages the write destination memory area of the unit data using the physical address. The control unit 23 instructs, designating the determined memory area (physical address), the memory I/F 22 to write the user data in the nonvolatile memory 3. The control unit 23 manages correspondence between logical addresses (logical addresses managed by the host 4) and physical addresses of the user data. When the control unit 23 receives a readout command including a logical address from the host 4, the control unit 23 specifies a physical address corresponding to the logical address and instructs, designating the physical address, the memory I/F 22 to read out the user data.

The ECC unit 24 encodes the user data stored in the data buffer 27 and generates parity. The ECC unit 24 includes an encoding unit 25 and a decoding unit 26. The encoding unit 25 encodes user data written in the same page (unit data) and generates parity (page parity). The page parity and the unit data from which the page parity was generated are written in a page. The encoding unit 25 encodes a plurality of unit data and generates parity (inter-page parity) different from the page parity. The decoding unit 26 performs decoding using the page parity. When error correction cannot be performed by the decoding using the page parity, the decoding unit 26 performs decoding using the inter-page parity. Details of the encoding and the decoding in this embodiment are explained below.

In FIG. 1, the configuration example in which the memory controller 2 includes the ECC unit 24 and the memory I/F 22 is shown. However, the ECC unit 24 can be incorporated in the memory I/F 22.

The data buffer 27 temporarily stores user data received from the host 4 until the user data is stored in the nonvolatile memory 3 and temporarily stores data read out from the nonvolatile memory 3 until the data is transmitted to the host 4. For example, the data buffer 27 is configured by a general-purpose memory such as a static random access memory (SRAM) or a dynamic random access memory (DRAM).

Figure 2:
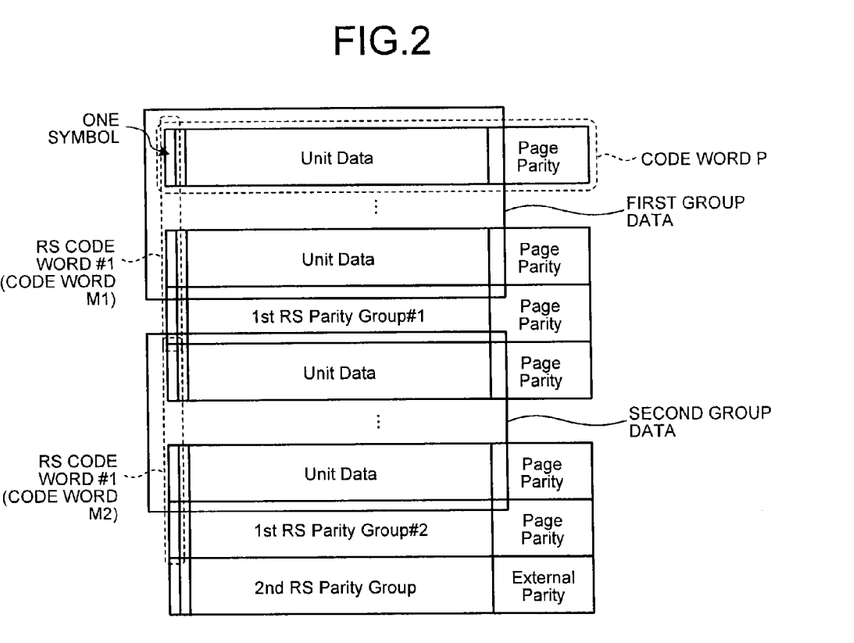
FIG. 2 is a diagram of an example of an encoding configuration in the first embodiment.

Error correction encoding and decoding in this embodiment are explained. FIG. 2 is a diagram of an example of an encoding configuration in this embodiment. The encoding unit 25 encodes user data (unit data) stored in one page of the nonvolatile memory 3 and generates page parity. Any error correcting code can be used for encoding for generating the page parity. For example, a BCH code is used. The memory I/F 22 writes the page parity in a page in which the corresponding unit data is written. Therefore, a code word P configured by the unit data and the page parity is written in one page. The page parity can be generated for two or more unit data. In that case, the page parity can be written in a page in which one of the two or more unit data is written or can be written in all pages in which the two or more unit data are written. The encoding unit 25 does not have to generate the page parity. The encoding unit 25 can generate the page parity for each of the pages according to a different error correction encoding method.

The encoding unit 25 performs encoding based on an incremental parity error correcting method (hereinafter, incremental parity correction encoding) using data selected out of a plurality of the unit data and generates parity in multiple stages. The incremental parity error correcting method in this embodiment indicates an encoding method employing a method of selecting a generator polynomial described in U.S. application Ser. No. 13/841,923. A generator polynomial used for generating parity in an i-th stage (i is an integer equal to or larger than 1 and equal to or smaller than n) has consecutive roots from roots of generator polynomials used for generating parity up to a (i−1)-th stage. Encoding based on a multigrain parity incremental error correcting method in this embodiment is an encoding method described in U.S. application Ser. No. 13/724,337. Specifically, the encoding based on the multigrain parity incremental error correcting method is a method that employs the method of selecting a generator polynomial described in U.S. application Ser. No. 13/841,923 and in which the number (the size) of data for generating parity is different for each of stages. The disclosures of U.S. application Ser. No. 13/724,337 and Ser. No. 13/841,923 are hereby incorporated by reference.

When the multigrain parity incremental error correcting method is used, the decoding process is performed as follows. First, the decoding is performed using parity in a first stage. When the decoding fails, decoding in a second stage having a higher correction capability than the first stage is performed using the parity in the first stage and the parity in the second stage.

In an example explained this embodiment, a Reed-Solomon (RS) code is used in the multigrain parity incremental error correcting method. However, an error correcting code used in the multigrain parity incremental error correcting method is not limited to the RS code and can be a BCH code and the like.

A generator polynomial used in encoding in a first stage in a parity incremental error correcting method is represented as $G_1(x)$ and a generator polynomial used in encoding in a second stage in the parity incremental error correcting method is represented as $G_2(x)$. Parity generated by the encoding in the first stage is represented as first RS parity (first parity) and parity generated by the encoding in the second stage is represented as second RS parity (second parity). In the parity incremental error correcting method, error correction is performed using roots of both of $G_1(x)$ and $G_2(x)$ in error correction in the second stage. Data input for the encoding in the second stage includes a plurality of code words in the first stage. Accordingly, the length of code words in the second stage is larger than the length of the code words in the first stage. Therefore, a Galois extension field for determining a code length needs to be adjusted to $G_2(x)$. In the parity incremental error correcting method, it is likely that the Galois field is large compared with the Galois filed in performing only the encoding in the first stage. The generator polynomial $G_2(x)$ has consecutive roots from roots of the generator polynomial $G_1(x)$.

In the example shown in FIG. 2, as the first RS parity, first RS parity #1 and first RS parity #2 are shown. Parity for the second RS parity is represented as external parity. The external parity is the same as external parity described in U.S. application Ser. No. 13/841,923. Any error correction code can be used for encoding for generating the external parity. In the example shown in FIG. 2, the external parity is written in a page on the nonvolatile memory 3 in which the second RS parity is stored. However, a place where the external parity is stored is not limited to the example shown in FIG. 2 and can be other pages on the nonvolatile memory 3 or can be storage media other than the nonvolatile memory 3.

Each of the unit data is configured by a plurality of symbols. In FIG. 2, symbols in the unit data are represented as first symbol, second symbol, and the like in order from the left side. In the example shown in FIG. 2, the encoding unit 25 selects first symbols respectively from the unit data, encodes a set of the first symbols collected from the unit data, and obtains an RS code word #1 (a code word M1). The number of symbols selected from one unit data can be two or more. Similarly, the encoding unit 25 selects second symbols respectively from the unit data, encodes a set of the second symbols collected from the unit data, and obtains an RS code word #2. The encoding unit 25 performs the same encoding concerning all the symbols configuring the unit data. When the encoding unit 25 encodes all the symbols configuring the unit data and obtains a set of RS code words (the RS code word #1, the RS code word #2, etc.), a set of the unit data, the symbols of which are encoded, is referred to as first group data and a set of parities is referred to as first RS parity group #1. The encoding unit 25 encodes the first RS parity group #1 and generates page parity. The memory I/F 22 writes the first RS parity group #1 and the page parity corresponding thereto in the same page of the nonvolatile memory 3.

The encoding unit 25 performs encoding in the first stage using a plurality of unit data not belonging to the first group data and generates a first RS parity group #2 in the same manner as the generation of the first RS parity group #1. The unit data used for the generation of the first RS parity group #2 is represented as second group data. For example, the encoding unit 25 encodes first symbols of the respective unit data of the second group data and generates an RS code word #1 (a code word M2) shown in FIG. 2. The encoding unit 25 encodes the first RS parity group #2 and generates page parity. The memory I/F 22 writes the first RS parity group #2 and the page parity corresponding thereto in the same page of the nonvolatile memory 3. In other words, the encoding unit 25 generates the first RS parity #1 for the first group data including two or more unit data using a first generator polynomial $G_1(x)$. The encoding unit 25 generates the first RS parity #2 for the second group data including two or more unit data using the first generator polynomial $G_1(x)$.

The encoding unit 25 selects first symbols from the first group data, the first RS parity group #1, the second group data, and the first RS parity group #2 and generates first parity symbol of second RS parity group according to the encoding in the second stage. Similarly, the encoding unit 25 selects second symbols and generates second parity symbol of second RS parity group according to the encoding in the second stage. When the encoding in the second stage is applied to all of the first group data, the first RS parity group #1, the second group data, and the first RS parity group #2, a second RS parity group is generated. In other words, the encoding unit 25 generates the second RS parity for the first group data, the second group data, the first RS parity #1, and the first RS parity #2 using a second generator polynomial $G_2(x)$. The encoding unit 25 encodes the second RS parity group and generates external parity. The memory I/F 22 writes the second RS parity group and the external parity corresponding thereto in the same page of the nonvolatile memory 3.

The first RS parity group is a parity group for one page, that is, a parity symbol per one code word is one symbol. However, an amount of the first RS parity, that is, a coding rate is not limited to this. Similarly, an amount of the second RS parity group is not limited to the example shown in FIG. 2. Storage positions of the first RS parity groups #1 and #2 and the second RS parity group in the nonvolatile memory 3 are not limited to the example shown in FIG. 2.

The first group data and the first RS parity group #1 are defined as a first code word group. The second group data and the first RS parity group #2 are defined as a second code word group. The two code words are encoded by the encoding in the second stage. However, three or more code words can be encoded by the encoding in the second stage. The number of symbols selected from a unit data of the first group data for the code word M1 can be different. Similarly, the number of symbols selected from a unit data of the second group data for the code word M2 can be different.

Figure 3:
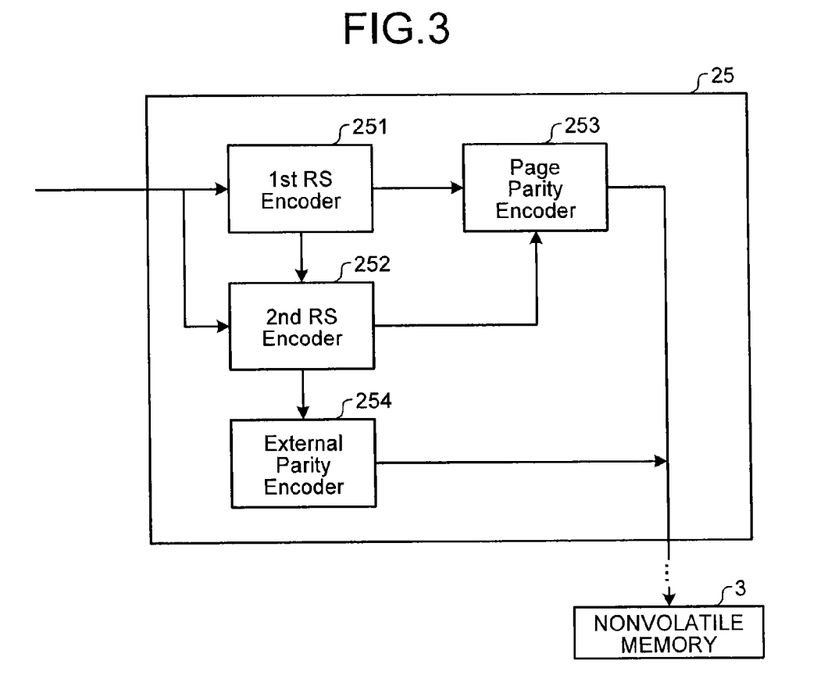
FIG. 3 is a diagram of a configuration example of an encoding unit in the first embodiment.

A specific example of encoding in this embodiment is explained. FIG. 3 is a diagram of a configuration example of the encoding unit 25 in this embodiment. The encoding unit 25 includes a first RS encoder 251, a second RS encoder 252, a page parity encoder 253, and an external parity encoder 254. Unit data is input to the first RS encoder 251 and the second RS encoder 252. The first RS encoder 251 encodes each of symbols of the unit data using the generator polynomial $G_1(x)$ (the first generator polynomial) and retains an intermediate result of a parity symbol for each of the symbols. The first RS encoder 251 inputs the unit data to the page parity encoder 253. When all the unit data of first group data is input, the first RS encoder 251 inputs an encoding result to the page parity encoder 253 and the second RS encoder 252 as a first RS parity group #1. Further, the first RS encoder 251 generates a first RS parity group #2 using the unit data of second group data and inputs the first RS parity group #2 to the page parity encoder 253 and the second RS encoder 252.

The second RS encoder 252 encodes the unit data of the first and second group data and the first RS parity groups #1 and #2 input thereto using the generator polynomial $G_2(x)$ (the second generator polynomial) for each of symbols and retains an intermediate result of a parity symbol for each of the symbols. When all of the unit data of the first and second group data and the first RS parity groups #1 and #2 are input, the second RS parity group (a third parity group) is completed. The external parity encoder 254 encodes the second RS parity group, generates external parity, and outputs the external parity.

The page parity encoder 253 encodes the input unit data, generates page parity, and outputs the code word P including the unit data and the page parity. The page parity encoder 253 encodes the input first RS parity group #1, generates page parity, and outputs the code word P including the first RS parity group #1 and the page parity. Similarly, the page parity encoder 253 encodes the input first RS parity group #2, generates page parity, and outputs the code word P including the first RS parity group #2 and the page parity. The memory I/F 22 writes, in the nonvolatile memory 3, the code word P in page units output from the page parity encoder 253. Note that, in FIG. 3, the memory I/F 22 is not shown.

The configuration example shown in FIG. 3 is only an example. The configuration of the encoding unit 25 is not limited to the example shown in FIG. 3. The encoding unit 25 does not have to include the external parity encoder 254. In the case, the second RS parity group can be input to the page parity encoder 253, and the page parity encoder 253 can generate external parity.

Figure 4:
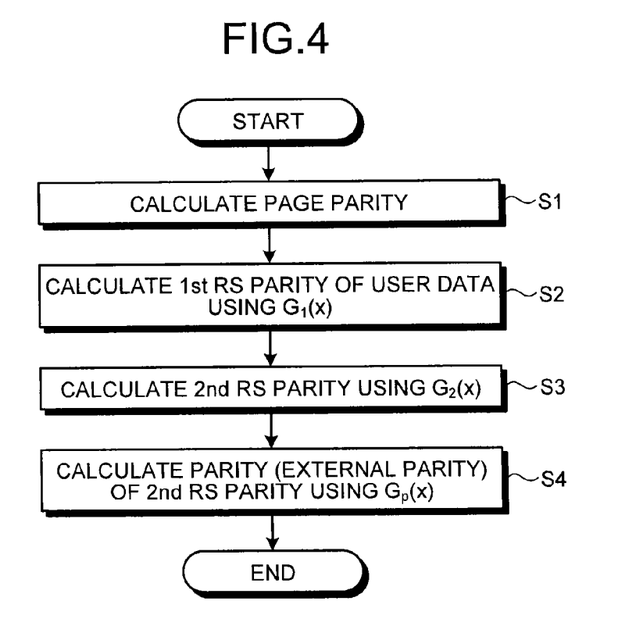
FIG. 4 is a flowchart for explaining an example of an encoding procedure in the first embodiment.

FIG. 4 is a flowchart for explaining an example of an encoding procedure in this embodiment. The encoding unit 25 generates page parity using unit data (step S1). The encoding unit 25 encodes first group data and second group data using the generator polynomial $G_1(x)$ and generates a first RS parity group #1 and a first RS parity group #2 (step S2). Subsequently, the encoding unit 25 subjects the first group data, the first RS parity group #1, the second group data, and the first RS parity group #2 to the encoding in the second stage using the generator polynomial $G_2(x)$ and generates a second RS parity group (step S3). The encoding unit 25 encodes the second RS parity group using a generator polynomial $G_p(x)$ and generates external parity (step S4). Any generator polynomial can be used as the generator polynomial $G_p(x)$. Note that, in FIG. 4, steps are described in the order of step S1, step S2, and step S3. However, actually, as explained using the configuration example shown in FIG. 3, the steps can be carried out in parallel. There is no limitation on the order of the steps except that the encoding in the second stage is performed after the first RS parity groups #1 and #2 are generated. Therefore, the order of the steps is not limited to the example shown in FIG. 4.

Figure 5:
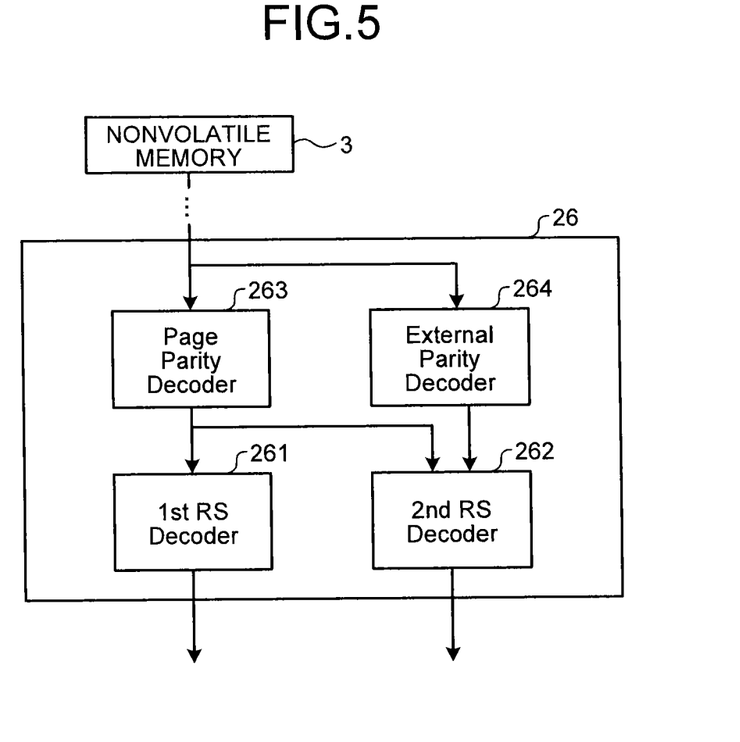
FIG. 5 is a diagram of a configuration example of a decoding unit in the first embodiment.
Figure 6:
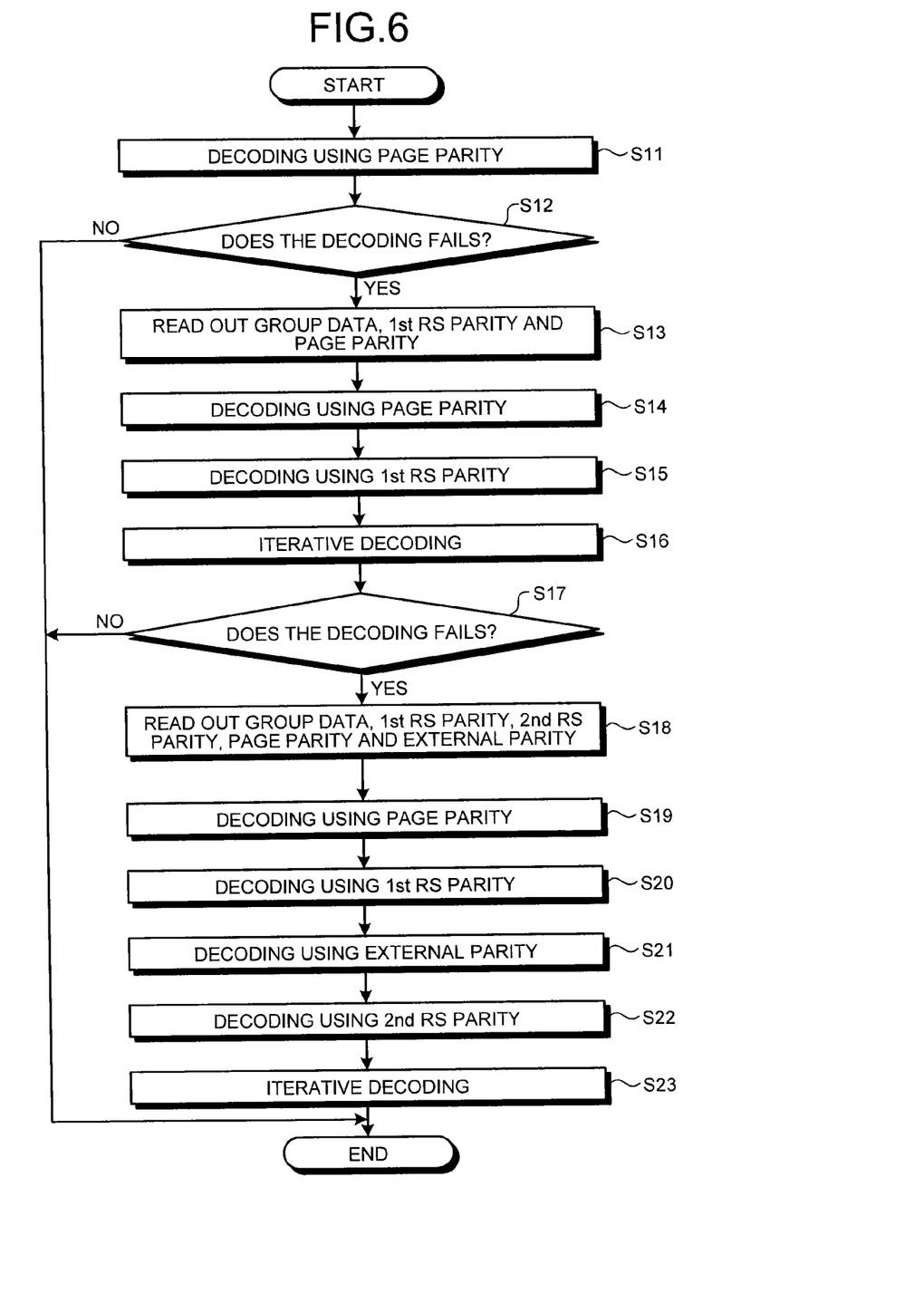
FIG. 6 is a flowchart for explaining an example of a decoding procedure in the first embodiment.

FIG. 5 is a diagram of a configuration example of the decoding unit 26 in this embodiment. FIG. 6 is a flowchart for explaining an example of a decoding procedure in this embodiment. Decoding in this embodiment is explained with reference to FIGS. 5 and 6. The decoding unit 26 includes a first RS decoder 261, a second RS decoder 262, a page parity decoder 263, and an external parity decoder 264.

The page parity decoder 263 performs decoding (internal decoding) using unit data and page parity read out from the nonvolatile memory 3 (step S11). The decoding includes error correction processing for correcting a bit detected as an error. The control unit 23 determines whether the decoding using the page parity fails (step S12). When the decoding fails (Yes at step S12), the control unit 23 instructs the memory I/F 22 to read out group data including the unit data with which the decoding fails, a first RS parity group corresponding to the group data, and page parity corresponding to the first RS parity group. The memory I/F 22 reads out, based on the instruction, the group data including the unit data with which the decoding fails, the first RS parity group corresponding to the group data, and the page parity corresponding to the first RS parity group from the nonvolatile memory 3 (step S13). For example, when the unit data with which the decoding fails belongs to a first group data, the corresponding first RS parity group is a first RS parity group #1. When the unit data with which the decoding fails belongs to second group data, the corresponding first RS parity group is a first RS parity group #2.

The page parity decoder 263 decodes the group data using the page parity (step S14). At step S14, the page parity decoder 263 decodes a first RS parity group corresponding to the group data using the page parity. The first RS decoder 261 decodes the group data using the first RS parity group (step S15). At this point, the first RS parity group used for the decoding and the group data to be decoded are decoded in advance using the page parity. The group data used in the preceding decoding and the first RS parity group corresponding to the group data are input to the second RS decoder 262. Consequently, if the remaining group data and a first RS parity group corresponding to the group data are input, all input data can be decoded using a second RS parity group.

After the decoding at step S15, when an uncorrectable error remains, the control unit 23 performs iterative decoding (step S16). The iterative decoding carried out at step S16 is processing for repeatedly executing the decoding performed using the page parity and the decoding performed using the first RS parity group. The iterative decoding is not mandatory. However, a correction capability can be improved by executing the iterative decoding. When all errors are successfully corrected by the decoding at step S15, the control unit 23 proceeds to step S17 without carrying out step S16.

After step S16, the control unit 23 determines whether the error correction for the unit data to be corrected is unsuccessful. Specifically, the result of decoding the unit data to be corrected using the corresponding page parity determines whether the error correction for the unit data is unsuccessful (step S17). When the correction is unsuccessful (Yes at step S17), the control unit 23 instructs the memory I/F 22 to read out data necessary for decoding the unit data to be corrected.

Specifically, the memory I/F 22 reads out, from the nonvolatile memory 3, data not read out yet among the second RS parity group and external parity, group data corresponding to the second RS parity group, and the first RS parity group (step S18). When the unit data to be corrected belongs to first group data, the data necessary for the decoding performed using the second RS parity group is the second group data, the first RS parity group #2, the second RS parity group, and the external parity.

The page parity decoder 263 decodes the group data and the first RS parity group read out at step S18 using the page parity (step S19). The first RS decoder 261 decodes the group data read out at step S18 using the first RS parity group (step S20). The external parity decoder 264 decodes second RS parity using the external parity (step S21).

The second RS decoder 262 decodes the group data input at step S14 and step S19 using the first RS parity groups #1 and #2 and the second RS parity group (step S22). If the input data is input to the second RS decoder 262 in parallel at a point of step S14, it is unnecessary to read out data used at step S14 again to perform step S22. When an error that cannot be corrected at step S22 remains, the control unit 23 performs iterative decoding (step S23) and ends the processing. The iterative decoding performed at step S23 is processing for repeatedly executing the decoding performed using the page parity and the decoding performed using the first RS parity group and the second RS parity group. When all the errors are successfully corrected by the decoding at step S22, the control unit 23 ends the processing without carrying out step S23.

When the correction is successful at step S12 (No at step S12), the control unit 23 ends the processing. When the correction is successful at step S17 (No at step S17), the control unit 23 ends the processing.

An effect of this embodiment is explained. In the example shown in FIG. 2, erasure correction by one parity symbol can be carried out in the decoding in the first stage and correction of one symbol can be carried out in the decoding in the second stage. A condition for obtaining the effect of this embodiment is that a readout time for group data from a NAND is longer than time for the iterative decoding. The group data is configured by a plurality of unit data, which are readout units. Usually, a readout time for each of unit data is longer than time of the decoding by the page parity. Therefore, a readout time for the group data is much longer than the time for the decoding by the page parity. The readout time for the group data is long compared with the time for the iterative decoding longer than the time for the decoding by the page parity. Therefore, the condition for obtaining the effect of the present invention is met. Under this condition, time required for performing the iterative decoding in the second stage after performing the iterative decoding in the first stage and time required for performing only the iterative decoding in the second stage without performing the iterative decoding in the first stage are substantially the same. This is because the readout time for the group data is predominant in the time. In short, the effect of the present embodiment is that, as long as the condition explained above is met, it is possible to perform the iterative decoding in the first stage for the moment without requiring extra time.

Second Embodiment

Figure 7:
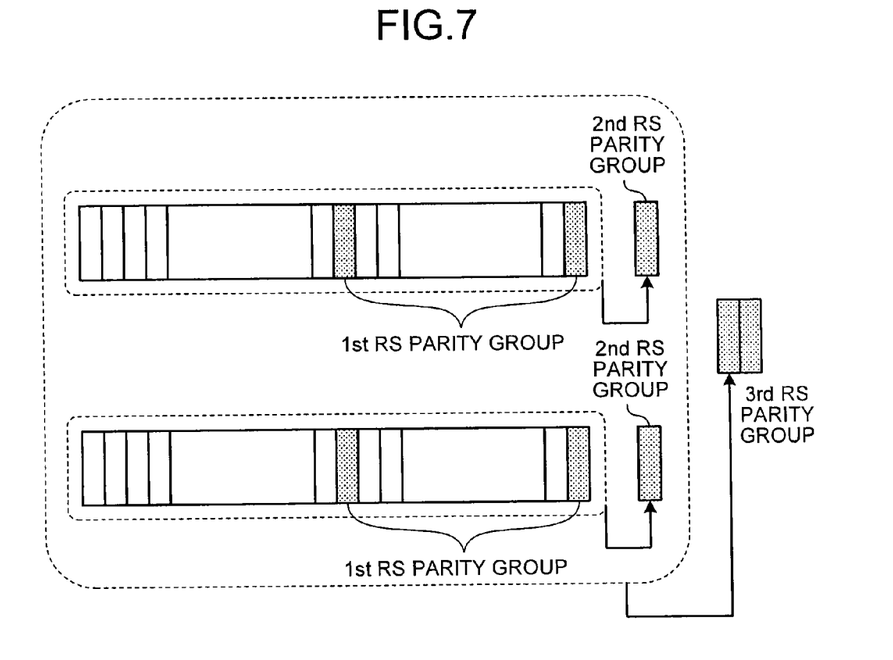
FIG. 7 is a diagram of an example of an encoding configuration in performing encoding in three stages.

In the example explained in the first embodiment, the stages of the multigrain parity incremental error correcting method are the two stages. However, the stages can be three or more stages. In an example explained in a second embodiment, encoding in three stages is explained. FIG. 7 is a diagram of an example of an encoding configuration in performing the encoding in the three stages. In FIG. 7, one rectangle indicates data for one page. A page without hatching indicates unit data. A hatched portion indicates data for one page including inter-page parity (a first RS parity, a second RS parity, and a third RS parity explained below).

The encoding in this embodiment is explained. As in the first embodiment, first RS parity is generated from data obtained from a plurality of unit data. The first RS parity and the data are collected to generate a first RS code word. Subsequently, second RS parity is generated using two first RS code words. The second RS parity and the first RS code words are collected to generate a second RS code word. Third RS parity is generated using two second RS code words. The third RS parity and the second RS code words are collected to generate a third RS code word. Then, as shown in FIG. 7, the third RS parity (third parity) is generated using two two-stage groups. A generator polynomial $G_3(x)$ used for the generation of the third RS parity is a generator polynomial in a third stage in a multistage encoding method described in U.S. application Ser. No. 13/724,337 and Ser. No. 13/841,923. That is, the generator polynomial $G_3(x)$ is a generator polynomial having consecutive roots from roots of the generator polynomials $G_1(x)$ and $G_2(x)$. Further, external parity is generated for a second RS parity group and a third RS parity group. In FIG. 7, the two second RS code words are used. However, the third RS parity can be generated using three or more second RS code words.

Decoding in this embodiment is the same as the decoding in the first embodiment up to the decoding in the second stage. When the decoding in the second stage is unsuccessful, the third RS code word is read out from the nonvolatile memory 3 and the decoding is carried out. When the decoding in the third stage is unsuccessful, the decoding performed using the page parity, the decoding in the first stage, and the decoding in the third stage are performed repeatedly in order to improve correction capability.

The configuration of the encoding unit 25 in this embodiment is, for example, a configuration in which a third RS encoder is added between the second RS encoder 252 and the external parity encoder 254 shown in FIG. 3. Unit data is input to the third RS encoder in parallel to the first RS encoder 251 and the second RS encoder 252. As the configuration of the decoding unit 26 in this embodiment, a configuration is conceivable in which, for example, a third RS decoder is added to the configuration shown in FIG. 5 and the external parity decoder 264 is connected to the third RS decoder. An output of the page parity decoder 263 is input to the third RS decoder in parallel to the first RS decoder 261 and the second RS decoder 262.

In this embodiment, if the condition explained in the first embodiment is met, time required for performing the decoding in the third stage after performing the iterative decoding in the first stage and the iterative decoding in the second stage is substantially the same as time required for performing only the decoding in the third state. Therefore, an average processing time in this embodiment is shorter than an average processing time in performing only non-multistage decoding equivalent to the decoding in the third stage. This is because it is likely that the processing ends in the iterative correction in the first stage or the iterative correction in the second stage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller for controlling a nonvolatile memory, comprising:
an encoding unit configured to:
generate a first parity group using a first generator polynomial, the first parity group being generated for first group data including first unit data and second unit data;
generate a second parity group using the first generator polynomial, the second parity group being generated for second group data including third unit data and fourth unit data; and
generate a third parity group using a second generator polynomial, the third parity group being generated for the first group data, the second group data, the first parity group, and the second parity group, the second generator polynomial having consecutive roots from roots of the first generator polynomial; and
a write control unit configured to:
write the first unit data, the second unit data, the third unit data, the fourth unit data, the first parity group, the second parity group, and the third parity group respectively in different pages of the nonvolatile memory.

2. The memory controller according to claim 1, further comprising a decoding unit configured to execute decoding in a first stage using the first group data and the first parity group and, when the decoding fails in the first stage, execute decoding in a second stage using the first group data, the second group data, the first parity group, the second parity group, and the third parity group.

3. The memory controller according to claim 1, wherein the encoding unit generates first page parity according to error correction encoding using the first unit data, and the write control unit writes the first unit data and the first page parity in one page.

4. The memory controller according to claim 3, further comprising a decoding unit configured to perform internal decoding using the first page parity and the first unit data, when the internal decoding fails, execute decoding in a first stage using the first group data and the first parity group, and, when the decoding fails in the first stage, execute decoding in a second stage using the first group data, the first parity group, the second group data, the second parity group, and the third parity group.

5. The memory controller according to claim 4, wherein, when the first unit data cannot be corrected by the internal decoding and cannot be corrected by the decoding in the first stage, the decoding unit repeats the internal decoding and the decoding in the first stage and, after the repetition, when the first unit data that cannot be corrected by the internal decoding cannot be corrected, executes the decoding in the second stage.

6. The memory controller according to claim 5, wherein, when the first unit data cannot be corrected by the internal decoding and cannot be corrected by the decoding in the second stage, the decoding unit repeats the internal decoding, the decoding in the first stage, and the decoding in the second stage.

7. The memory controller according to claim 1, wherein the encoding unit applies error correction encoding to the third parity group and generates external parity.

8. The memory controller according to claim 7, further comprising a decoding unit configured to execute decoding in a first stage using the first group data and the first parity group and, when the first unit data cannot be corrected by the internal decoding and the decoding fails in the first stage, decode the third parity group using the external parity and execute decoding in a second stage using the first group data, the first parity group, the second group data, the second parity group, and the third parity group after the decoding performed using the external parity.

9. The memory controller according to claim 1, wherein the encoding unit is configured to:
generate a fourth parity group using the first generator polynomial, the fourth parity group being generated for third group data including fifth unit data and sixth unit data;
generate a fifth parity group using the first generator polynomial, the fifth parity group being generated for fourth group data including seventh unit data and eighth unit data;
generate a sixth parity group using the second generator polynomial, the sixth parity group being generated for the third group data, the fourth group data, the fourth parity group, and the fifth parity group; and
generate a seventh parity group using a third generator polynomial, the seventh parity group being generated for the first group data, the first parity group, the second group data, the second parity group, the third parity group, the third group data, the fourth parity group, the fourth group data, the fifth parity group, and the sixth parity group, and
wherein the write control unit is configured to write the fifth unit data, the sixth unit data, the fifth parity group, and the sixth parity group in different pages of the nonvolatile memory.

10. The memory controller according to claim 9, further comprising a decoding unit configured to perform internal decoding using the first page parity and the first unit data, when the internal decoding fails, execute decoding in a first stage using the first group data and the first parity, when the decoding fails in the first stage, execute decoding in a second stage using the first group data, the first parity group, the second group data, the second parity group, and the third parity group, and, when the error correction cannot be performed by the decoding in the second stage, execute decoding in a third stage using the first group data, the first parity group, the second group data, the second parity group, the third parity group, the third group data, the fourth parity group, the fourth group data, the fifth parity group, the sixth parity group, and the seventh parity group.

11. The memory controller according to claim 9, wherein the encoding unit generates, for the sixth parity group, external parity using error correction encoding.

12. The memory controller according to claim 1, wherein the encoding unit generates a first parity group, a second parity group, and a third parity group according to Reed-Solomon encoding processing.

13. A storage device comprising:
a nonvolatile memory;
an encoding unit configured to:
generate a first parity group using a first generator polynomial, the first parity group being generated for first group data including first unit data and second unit data;
generate a second parity group using the first generator polynomial, the second parity group being generated for second group data including third unit data and fourth unit data; and
generate a third parity group using a second generator polynomial, the third parity group being generated for the first group data, the second group data, the first parity group, and the second parity group, the second generator polynomial having consecutive roots from roots of the first generator polynomial; and
a write control unit configured to:
write the first unit data, the second unit data, the third unit data, the fourth unit data, the first parity group, the second parity group, and the third parity group respectively in different pages of the nonvolatile memory.

14. A memory control method for controlling a nonvolatile memory, comprising:
generating a first parity group using a first generator polynomial, the first parity group being generated for first group data including first unit data and second unit data;
generating a second parity group using the first generator polynomial, the second parity group being generated for second group data including third unit data and fourth unit data;
generating a third parity group using a second generator polynomial, the third parity group being generated for the first group data, the second group data, the first parity group, and the second parity group, the second generator polynomial having consecutive roots from roots of the first generator polynomial; and
writing the first unit data, the second unit data, the third unit data, the fourth unit data, the first parity group, the second parity group, and the third parity group respectively in different pages of the nonvolatile memory.

* * * * *